(12) United States Patent
Kukita et al.

(10) Patent No.: US 6,676,432 B2
(45) Date of Patent: Jan. 13, 2004

(54) PGA SOCKET

(75) Inventors: Hiroaki Kukita, Yokohama (JP); Yoshifumi Nishida, Yokohama (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 10/142,185

(22) Filed: May 9, 2002

(65) Prior Publication Data

US 2002/0168888 A1 Nov. 14, 2002

(30) Foreign Application Priority Data

May 14, 2001 (JP) ........................................ 2001-143125

(51) Int. Cl.[7] ............................................. H01R 13/625
(52) U.S. Cl. ....................................................... 439/342
(58) Field of Search .................................. 439/342, 259

(56) References Cited

U.S. PATENT DOCUMENTS 6,231,367 B1 * 5/2001 Hsiao et al. ................. 439/342
6,243,267 B1 * 6/2001 Chuang ....................... 439/342

* cited by examiner

*Primary Examiner*—Gary Paumen
(74) *Attorney, Agent, or Firm*—Rosenthal & Osha L.L.P.

(57) ABSTRACT

An eccentric member 5 having a first shaft portion 51 provided with a concavity 51*a* and an eccentric portion 52 having a medial axis different from a medial axis of the first shaft portion 51 and formed continuously at one end of the first shaft portion 51 is used. The concavity 51*a* has a concavity with a boundary line dividing the concavity 51*a* into a rectangular shape on a surface of the first shaft portion 51. A tip portion of a flat blade screwdriver is fitted in the concavity 51*a* and the flat blade screwdriver is rotated to slide the cover housing 3 over the base housing 2.

3 Claims, 6 Drawing Sheets

PGA SOCKET

BACKGROUND OF THE INVENTION

The present invention relates to a PGA socket that is used when a PGA (Pin Grid Array) package provided with a plurality of pins in a grid array fashion is connected to a printed circuit board and the like.

In a desktop computer etc., a PGA socket 100 shown in FIG. 6, for example, has been used when a PGA package such as CPU (Central Processing Unit) provided with a plurality of pins in a grid array fashion is connected to a printed circuit board and the like.

The conventional PGA socket 100 shown in FIG. 6 comprises a base housing 101 formed with contact holes (not shown) in a grid array fashion, contacts (not shown) held in the contact holes of the base housing 101, a cover housing 102 formed with through holes 102a in a grid array fashion through which pins of a PGA package can be inserted and a lever 103 as a sliding mechanism for sliding the cover housing 102 over the base housing 101. The lever 103 is in an L-like shape including a handle portion 103a, which is gripped and rotated in a vertical direction by operators. When the lever 103 is rotated in a vertical direction in the PGA socket 100, the cover housing 102 is slid over the base housing 101 and the pins of the PGA package and the contacts are in contact with each other. As a result, the PGA package and a printed circuit board on which the PGA socket is mounted are electrically connected to each other.

Prices of desktop computers including the above-mentioned conventional PGA sockets have been reduced. For realizing a more reduced price, it is required to reduce unit prices of parts for instance the PGA sockets. However, the unit price of the above-mentioned conventional PGA socket 100 was not low enough to satisfy the requirement. In the above-mentioned conventional PGA socket 100, not so strong force is needed when the cover housing 102 is slid over the base housing 101. Therefore, when a PGA socket of which unit price is low is provided, it is desirable that the PGA socket does not need so strong force to slide a cover housing over a base housing as the conventional PGA socket 100.

It is an object of the present invention to provide a PGA socket of low unit price capable of sliding a cover housing over a base housing with a small force.

BRIEF SUMMARY OF INVENTION

A PGA socket of the present invention comprises a base housing formed with a large number of contact holes in a grid array fashion, a cover housing located to overlap the base housing and formed with a large number of through holes in a grid array fashion through which pins of a PGA package can be inserted, a sliding mechanism for sliding the cover housing over the base housing, and a plurality of contacts held in the contact holes of the base housing and being in contact with the pins of the PGA package by slide operation of the cover housing caused by the sliding mechanism, wherein the sliding mechanism includes a rotatable operating portion having a step on an outer surface in a diametrical direction and a press-fitting portion for press-fitting the cover housing with rotation of the operating portion in a direction of sliding of the cover housing over the base housing.

According to the PGA socket having the above-mentioned structure, an operating tool (a tool used for sliding a cover housing over a base housing) is fitted in the step provided on the outer surface of the operating portion of the sliding mechanism in a diametrical direction and then the operating tool is rotated about a fitting portion with the operating portion. The operating portion may be thereby rotated with a small force according to a length of the operating tool to slide the cover housing over the base housing. Since the sliding mechanism is capable of sliding the cover housing over the base housing only with the operating portion and the press-fitting portion, it is unnecessary to provide a lever. This enables reduction of the unit price of the PGA socket by a price of the lever. Further, since the sliding mechanism does not have an equivalent to the handle portion 103a of the lever 103 of the conventional PGA socket 100, it is possible to locate components in a space in which the handle portion 103a was located. As a result, miniaturization of various kinds of equipments such as personal computers including the PGA sockets may be realized.

In the above-mentioned PGA socket, the step has a concavity with a boundary line dividing the step into a rectangular shape on the surface of the operating portion. According to the PGA socket having this structure, screwdrivers and the like that are mostly available at home and offices may be used as an operating tool. As a result, reduction of prices of various equipments including PGA sockets may be realized since it is unnecessary to prepare special purpose tools.

DETAILED DESCRIPTION OF THE PREFERRED EMBODIMENTS

The preferred embodiment of the present invention will be described below with reference to the drawings.

Figure 1:
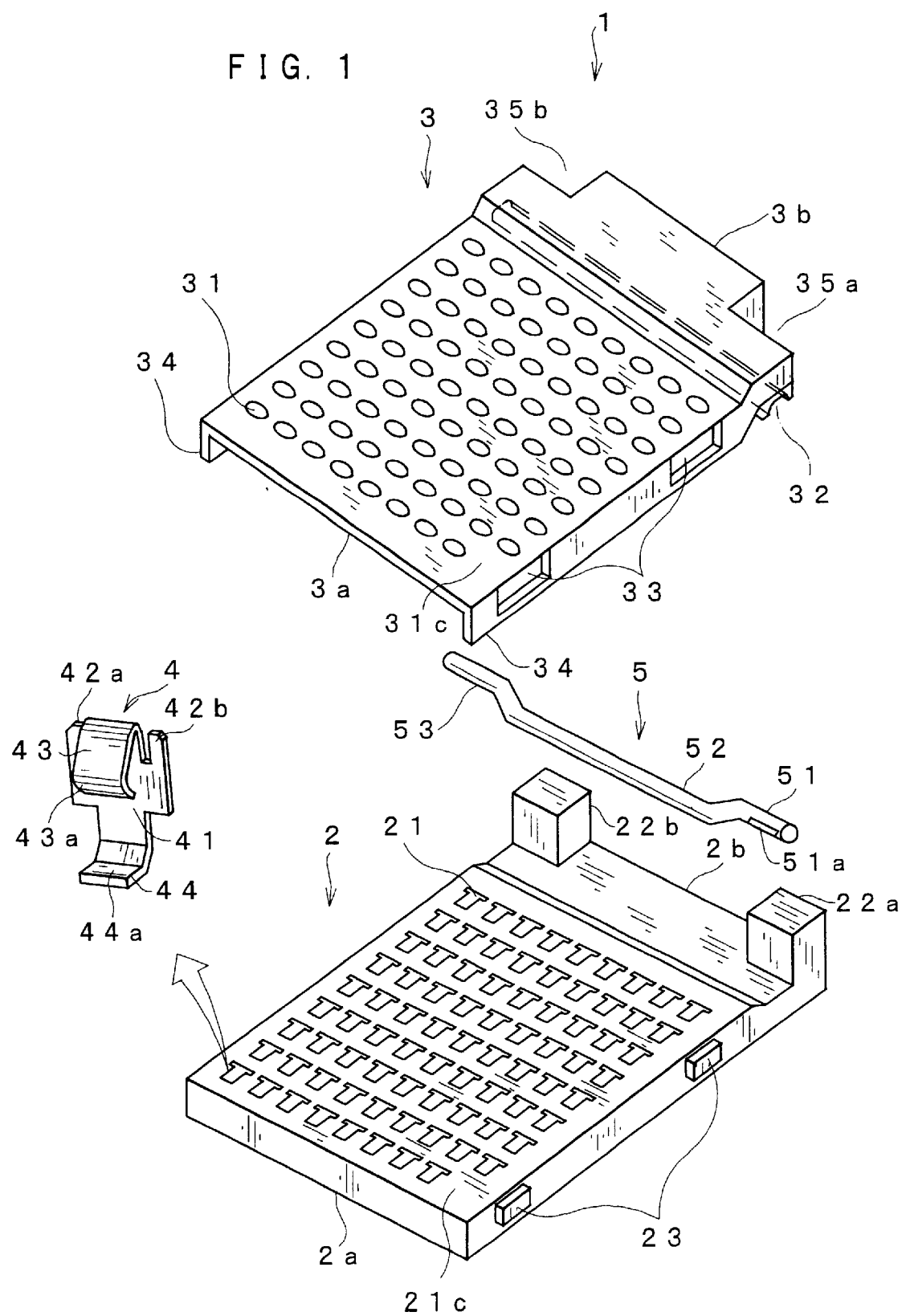
FIG. 1 is an exploded perspective view schematically showing a PGA socket according to embodiments of the present invention.
Figure 2A:
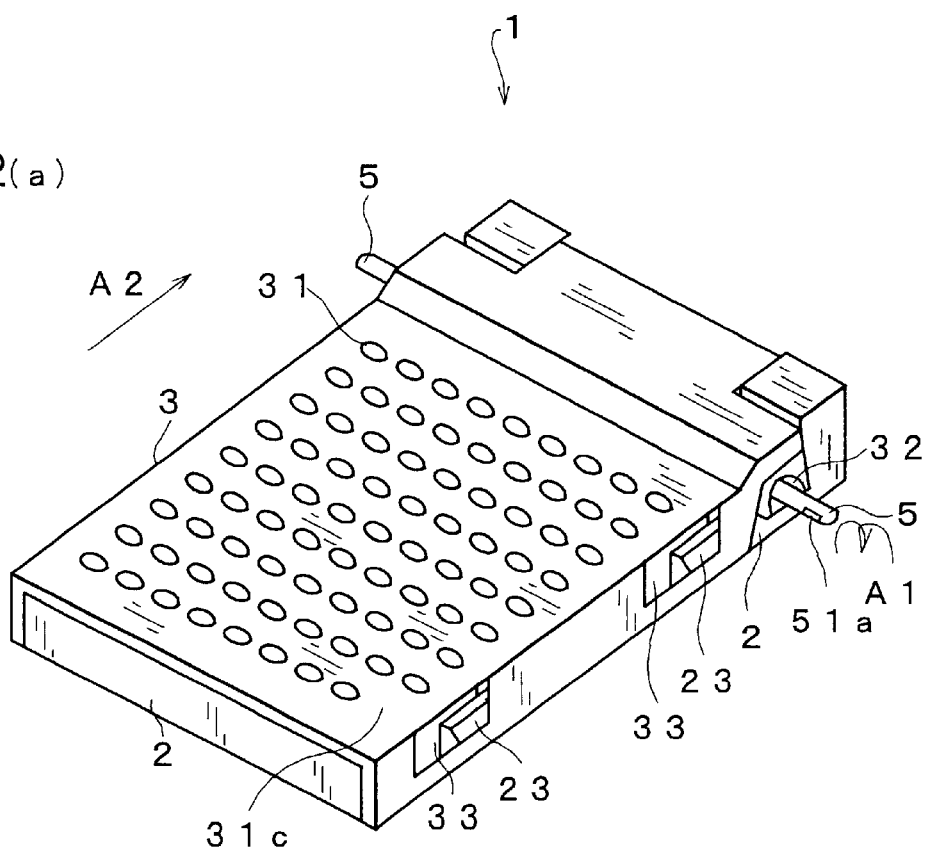
FIG. 2 is a perspective view schematically showing the PGA socket shown in FIG. 1.
Figure 2B:
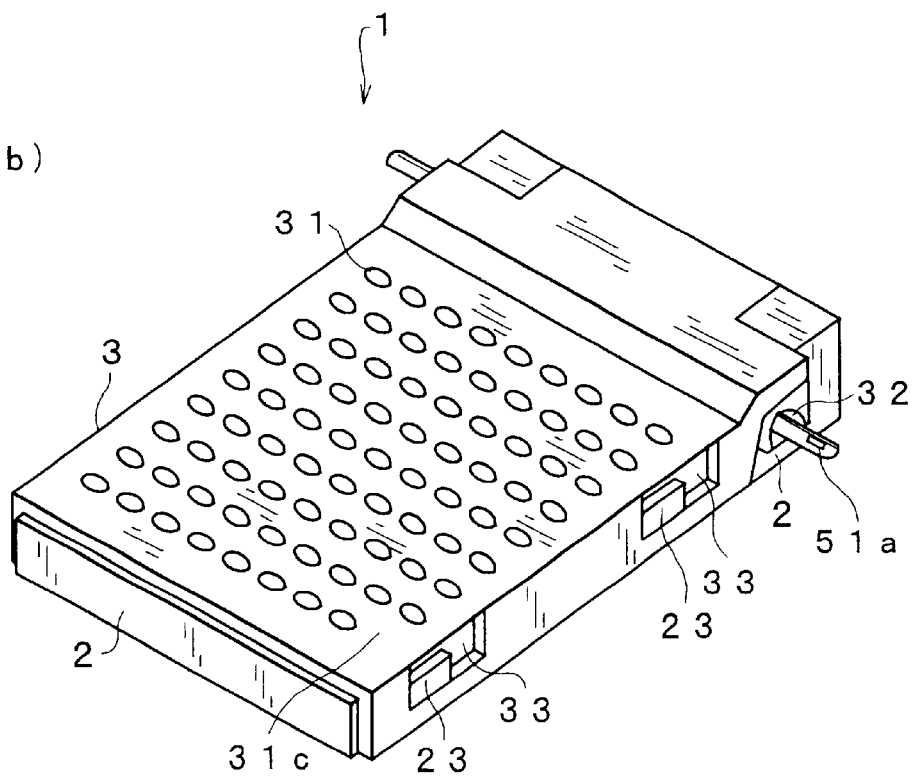
Figure 3:
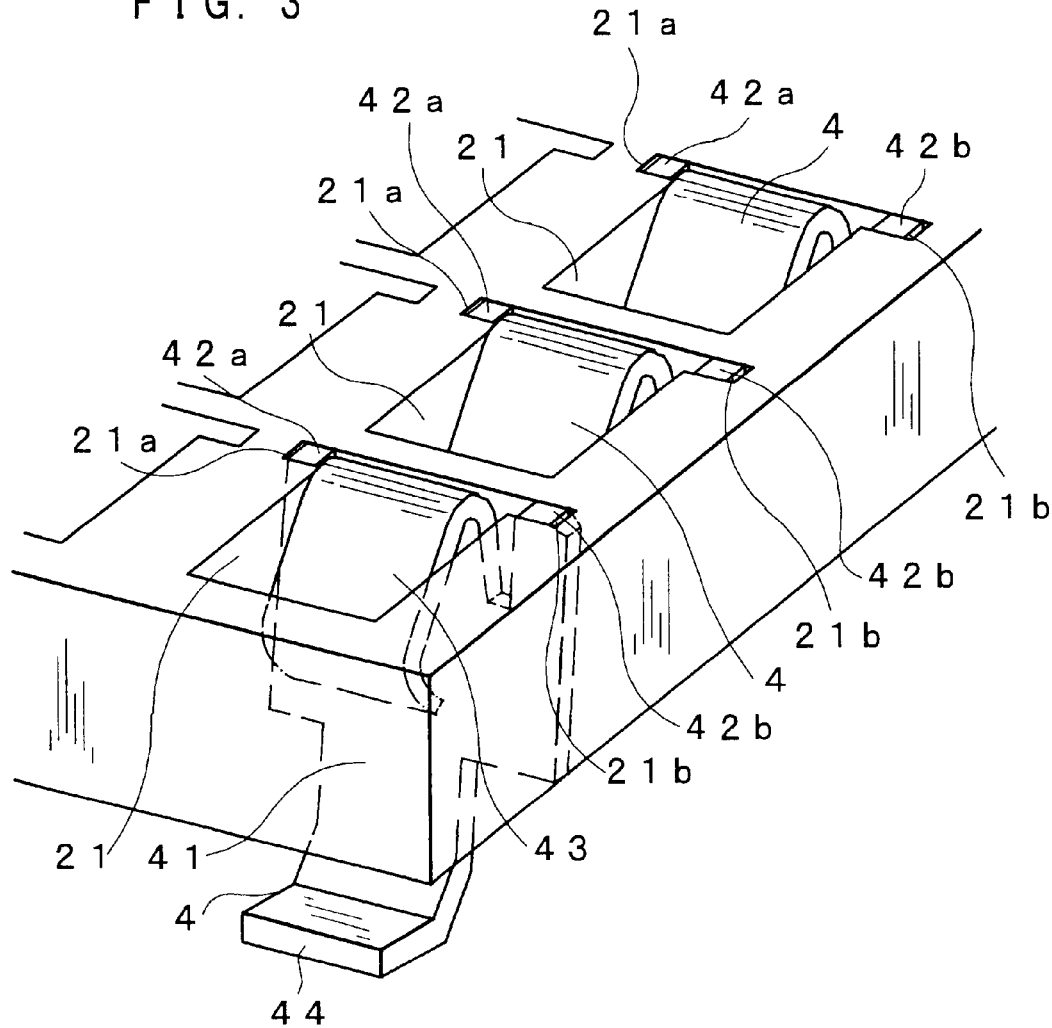
FIG. 3 is a partially perspective view schematically showing a base housing including contacts shown in FIG. 1.

First, a structure of a PGA socket according to the embodiment of the present invention will be described with reference to FIGS. 1–3. FIG. 1 is an exploded perspective view schematically showing a PGA socket. FIG. 2 is a perspective view schematically showing the PGA socket; (a) illustrates a condition before sliding and (b) illustrates a condition after sliding. FIG. 3 is a partially perspective view schematically showing a base housing including contacts.

A PGA socket 1 shown in FIGS. 1 and 2 comprises a base housing 2, a cover housing 3 located to overlap the base housing 2, a plurality of contacts 4, and an eccentric member 5. The contacts 4 are made of conductive material. The base housing 2 and the cover housing 3 are made of nonconductive material.

The base housing 2 is integrally formed with a substantially plate-like contact hole portion 2a formed with a plurality of contact holes 21 therethrough between upper and lower surfaces thereof in a grid array fashion and a substantially plate-like eccentric member holding portion 2b formed continuously at one side surface of the contact hole portion 2a, which is of less thickness than the contact hole portion 2a. Substantially rectangular solid projecting portions 22a, 22b extending upwardly are on both ends of the eccentric member holding portion 2b opposite to the contact hole portion 2a.

The contact holes 21 formed in the contact hole portion 2a of the base housing 2 are of substantially square cross sections. As shown in FIG. 3, concavities 21a, 21b are formed on ends of a pair of side surfaces of each of the contact holes 21. A part 21c is not formed with the contact holes 21 for preventing erroneous insertion.

The contact hole portion 2a of the base housing 2 is provided with two projecting portions 23 (only one side shown) on each of a pair of side surfaces. As shown in FIG. 2, the projecting portions 23 are inserted in opening portions 33 of the cover housing 3, which are described below. This prevents the base housing 2 and the cover housing 3 from easily detaching.

The cover housing 3 is integrally formed with a plate-like through hole portion 3a formed with a plurality of through holes 31 therethrough between upper and lower surfaces thereof in a grid array fashion and an eccentric member holding portion 3b formed continuously at an end of the through hole portion 3a. A concavity 32 extending from one side surface to an opposing side surface of the eccentric member holding portion 3b is formed on the lower surface thereof (i.e. a surface facing the base housing 2). The concavity 32 is turned towards a through hole portion 3a side at a region including a midpoint of the concavity 32 for preventing the eccentric member 5 from being detached from the PGA socket 1 after the PGA socket is assembled. The concavity 32 is to house the eccentric member 5 therein. The concavity 32 is of such size as to be able to house the eccentric member 5 and to slide the cover housing 3 over the base housing 2 to a position where pins of a PGA package are in contact with the contacts 4 when a below-described eccentric portion 52 pushes an inner wall of the concavity 32. Substantially rectangular solid notches 35a, 35b are provided on both ends of the eccentric member holding portion 3b opposite to the through hole portion 3a.

The through holes 31 formed in the through hole portion 3a of the cover housing 3 are of substantially circle cross sections. A part 31c is not formed with the through holes 31 for preventing erroneous insertion.

The cover housing 3 is formed with a pair of extending portions 34 extending downwardly. Two opening portions 33 (only one side shown), which are substantially rectangular, are provided on each of the extending portions 34. A size of the height direction of each of the opening portions 33 is slightly larger than a size for the projecting portions 23 of the base housing 2 to be inserted for the purpose of preventing the cover housing 3 from wobbling on the base housing 2 in a vertical direction. A size of the width direction of each of the opening portions 33 is larger than a size of the width direction of the projecting portions 23 so that the pins of the PGA package and the contacts 4 may be in contact and out of contact by slide operation of the cover housing 3 over the base housing 2.

The contact 4 includes a plate-like base portion 41, a pair of projecting portions 42a, 42b provided continuously at one end of the base portion 41 so as to extend in a direction substantially equal to the base portion 41, a turned portion 43 provided continuously at the end of the base portion 41 so as to face the base portion 41, and a tail portion 44 provided continuously at the other end of the base portion 41 so that a surface 44a on a tip portion side may be substantially perpendicular to a surface of the base portion 41.

As shown in FIG. 3, the projecting portions 42a, 42b functioning as press-fitted portions are respectively press-fitted in concavities 21a, 21b in the contact hole 21 formed in the base housing 2. The contact 4 is hereby held in the base housing 2. The turned portion 43 functioning as a contact portion is bent at obtuse angle so that a contact portion 43a projecting into opposite side to the base portions 41 is provided therewith. The contact portion 43a is to be in contact with the pins of the PGA package. The tail portion 44 functioning as a soldering portion is to be soldered for the PGA socket 1 to be mounted on a board.

Since the above-mentioned turned portion 43 of the contact 4 is formed by being turned from an end of the base portion 41 opposite to the tail portion 44, the contact 4 has a structure in which flux is unlikely to adhere on the contact portion 43a of the turned portion 43 of the contact 4. As a result, a loose electrical connection of the contacts 4 and the pins of the PGA package is unlikely to occur. Yield of products including the PGA sockets is thereby increased.

An eccentric member 5, which is a main member comprising a slide mechanism, includes a substantially cylindrical first shaft portion (i.e. an operating portion) 51, a substantially cylindrical eccentric portion (i.e. a press-fitting portion) 52 continuously formed from an end of the first shaft portion 51 so as to have a medial axis that is different from a medial axis of the first shaft portion 51, and a second shaft portion 53 continuously formed from an end of the eccentric portion 52 so as to have the same medial axis as the first shaft portion 51. A concavity i.e. a step) 51a is provided in a diametrical direction on an outer surface of the first shaft portion 51 along in a direction of the medial axis of the first shaft portion 51. A boundary line on the outer surface of the first shaft portion 51 divides the concavity 51a into a rectangular shape. The concavity 51a receives an operating tool such as flat blade screwdrivers therein. The eccentric member 5 is held by the concavity 32 formed in the eccentric member holder 3b of the cover housing 3.

Figure 4:
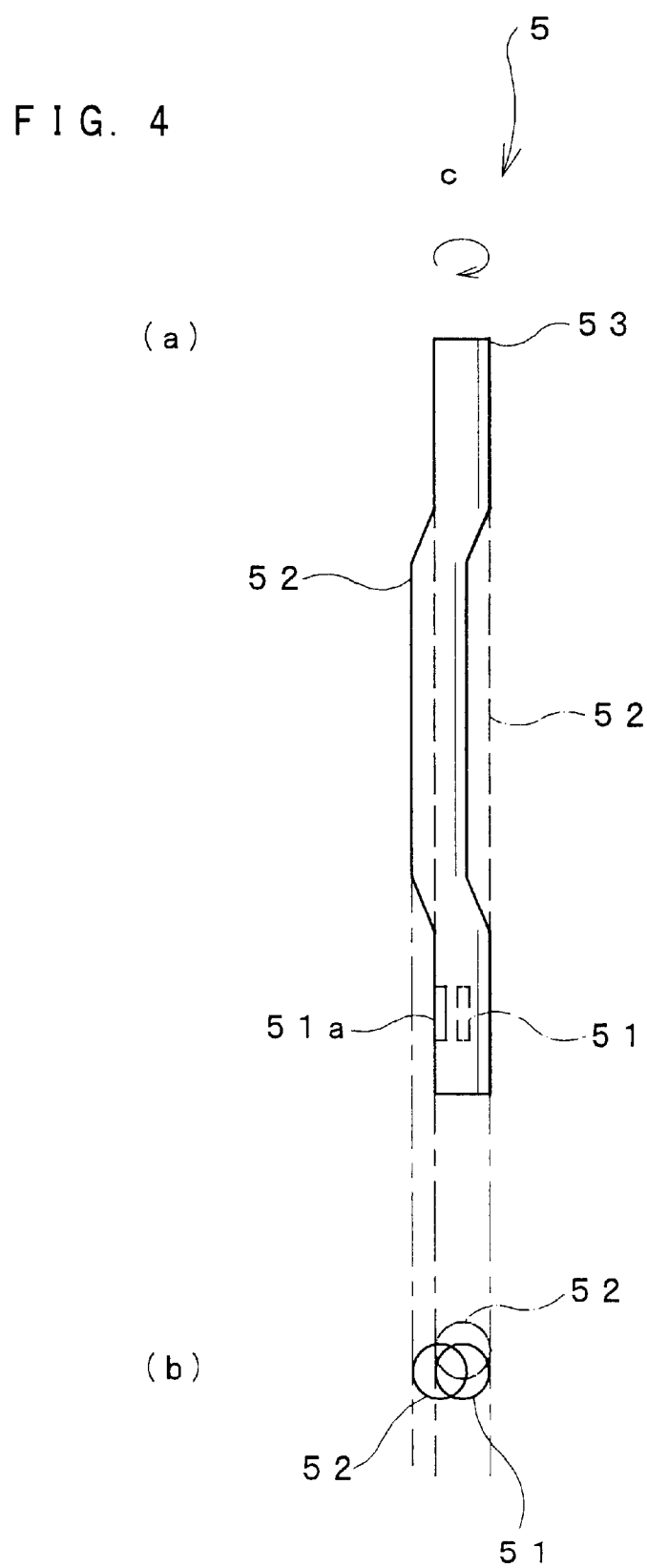
FIG. 4 is an explanatory diagram of an operation of an eccentric member included in the PGA socket shown in FIG. 1.

Next, an operation of the eccentric portion 52 of the eccentric member 5 will be described with reference to FIG. 4. FIG. 4 is an explanatory diagram of an operation of the eccentric member 5 included in a PGA socket; (a) schematically shows a top plan view and (b) schematically shows a side view. A continuous line in FIG. 4 shows a condition of the eccentric member 5 before operation and a dotted line in FIG. 4 shows a condition of the eccentric member 5 after operation.

When a tip portion of a flat blade screwdriver is fitted to the concavity 51a of the eccentric member 5 and rotated at an angle of 90 degrees in a direction of an arrow c in FIG. 4(a), the first shaft portion 51 and the second shaft portion 53 rotate without being dislocated while the medial axis of the eccentric portion 52 moves in a circle and the eccentric portion 52 is dislocated at an angle of 90 degrees.

Figure 5:
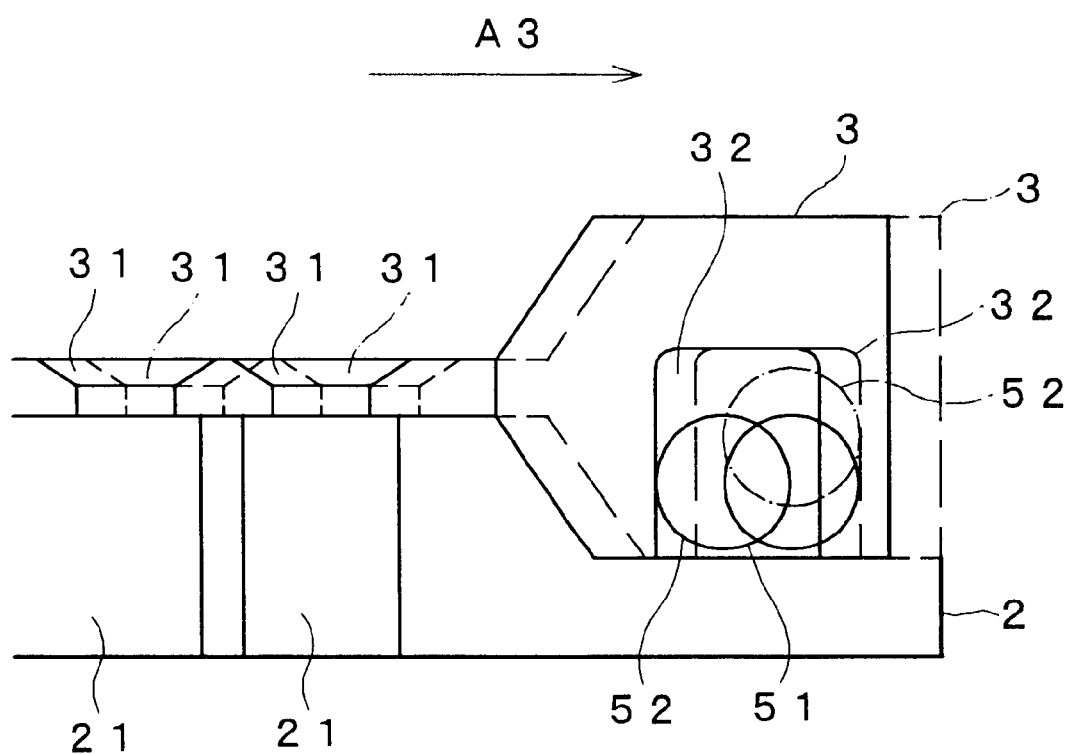
FIG. 5 is an explanatory diagram of conditions before and after sliding of the PGA socket shown in FIG. 1.
Figure 6:
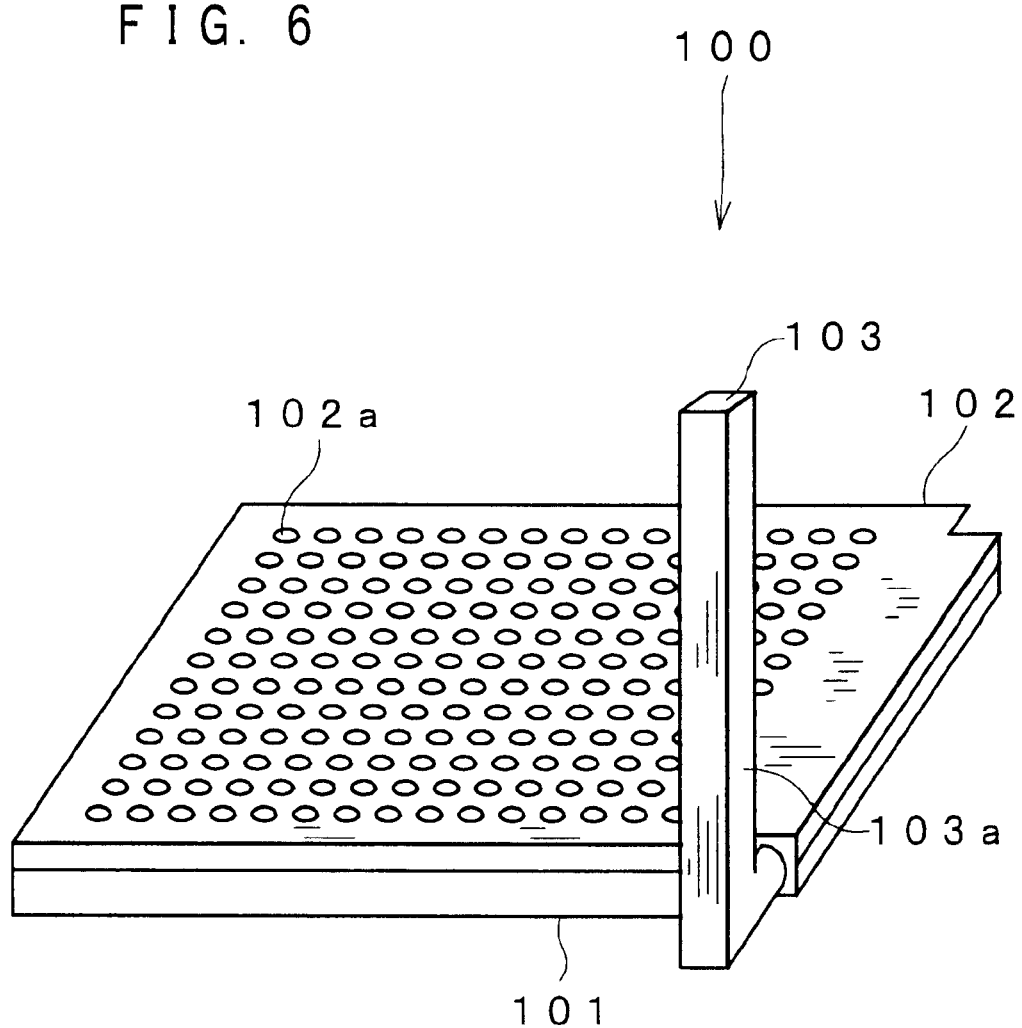
FIG. 6 is a perspective view schematically showing a conventional PGA socket.

Further, a condition in which the cover housing 3 is slid over the base housing 2 by an operation of the eccentric member 5 will be described with reference to FIG. 5. FIG. 5 is an explanatory diagram of conditions before and after sliding of a PGA socket. A continuous line in FIG. 5 shows a condition before sliding and a dotted line in FIG. 5 shows a condition after sliding. Before the cover housing 3 is slid over the base housing 2, pins of a PGA package are inserted in advance through the through holes 31 of the cover housing 3 to a position in which the pins of the PGA package face the turned portions 43 of the contacts 4 without contacting the cover housing 3, the base housing 2, and the contacts 4.

Before sliding, the eccentric portion 52 of the eccentric member 5 is arranged so as to be located on a side of the contact hole portion 2a of the base housing 2 and the through hole portion 3a of the cover housing 3, as shown in FIG. 5.

When a tip portion of a flat blade screwdriver is fitted to the concavity 51a of the eccentric member 5 and the screwdriver is rotated at an angle of 90 degrees in a direction of an arrow A1 in this condition, the eccentric portion 52 of the eccentric member 5 moves in a circle as described above. While moving, the eccentric portion 52 of the eccentric member 5 contacts an inner wall of the concavity 32 of the cover housing 3. From then on, the eccentric portion 52 of the eccentric member 5 pushes the inner wall in a direction of arrow A3 in FIG. 5. The cover housing 3 is hereby slid over the base housing 2 in a direction of arrow A2 in FIG. 2 (i.e. a direction of arrow A3 in FIG. 5).

While the cover housing 3 is slid, inner walls of the through holes 31 of the cover housing 3 contact pins of a PGA package. By being pushed by the inner walls of the through holes 31 of the cover housing 3, the pins move in a direction of arrow A3 in FIG. 5 to be in contact with the contacts.

According to the PGA socket of the embodiment of the present invention, a flat blade screwdriver is fitted in the concavity (i.e. a step) 51a provided in a diametrical direction on the outer surface of the first shaft portion (i.e. an operating portion) 51 and then the flat blade screwdriver is rotated about a fitting portion with the concavity 51a to slide the cover housing 3 over the base housing 2 with a small force according to a length of the flat blade screwdriver. Since the eccentric member 5 is arranged so that rotating shafts of the first shaft portion 51 and the second shaft portion 53 are perpendicular to the pins, it is possible and easy to rotate a flat blade screwdriver above a board (a sufficient space is frequently given) on which the PGA socket 1 is mounted.

Since the eccentric member 5, which is a main member comprising the sliding mechanism, has a structure without a handle portion 103a of a lever 103 of a conventional PGA socket 100, a unit price of the PGA socket may be limited to be low. Also, since the sliding mechanism does not have an equivalent to the handle portion 103a of the lever 103 of the conventional PGA socket 100, it is possible to locate components in a space in which the handle portion 103a was located. As a result, miniaturization of various kinds of equipments including the PGA sockets such as personal computers may be realized.

Further, since the concavity 51a has a concavity with a boundary line dividing the concavity 51a into a rectangular shape on the outer surface of the first shaft portion 51, screwdrivers and the like that are mostly available at home and offices may be used as an operating tool. As a result, reduction of prices of various equipments including the PGA socket 1 may be realized since it is unnecessary to prepare special purpose tools.

Although the preferred embodiments of the present invention have been described, the present invention is not limited thereto. Various changes and modifications to the preferred embodiments are possible within the scope of the invention claimed. For example, although the concavity 51a provided in the first shaft portion 51 of the eccentric member 5 is rectangular, the concavity may be in a cross shape and a Phillips screwdriver may be used instead of a flat blade screwdriver. Also, a slightly projecting convex portion may be provided instead of a concavity, for which a range may be used. Further, various contacts including the contact 4, which is already known, may be used. Furthermore, the eccentric member 5 may have a structure of a cantilever in which only the first shaft portion 51 and the eccentric portion 52 are provided without provision of the second shaft portion 52. Moreover, the first shaft portion (i.e. operating portion) 51 and the eccentric portion i.e. press-fitting portion) 52 may be structured of different members separately and the eccentric portion 52 may slide the cover housing 2 over the base housing 3 with rotation of the first shaft portion 51.

What is claimed is:

1. A PGA socket comprising:

a base housing formed with a large number of contact holes in a grid array fashion, a cover housing located to overlap the base housing and formed with a large number of through holes in a grid array fashion through which pins of a PGA package can be inserted, a shaft having a substantially straight shape with a pressing portion thereof being eccentric to an operating portion thereof, the operating portion having a step on an outer circumferential surface, and a plurality of contacts held in the contact holes of the base housing and being in contact with the pins of the PGA package when the cover housing slides over the base housing in a direction, wherein the slide of the cover housing is caused when the operating portion is axially rotated and the cover housing is pressed by the pressing portion.

2. The PGA socket according to claim 1, wherein the step has a concavity with a boundary line dividing the step into a rectangular shape on a surface of the operating portion.

3. A PGA socket comprising:

a base housing having a first contact hole and a projecting portion;

a shaft having a first portion having a first axis of rotation and a second portion having a second axis of rotation; and a cover housing having a second contact hole corresponding to the first contact hole, an opening portion formed to fit around the projecting portion, and a concavity formed to engage the shaft, wherein the cover housing is formed to slide over the base housing;

wherein covering housing slides over the base housing to lock the projecting portion in the opening portion when the first portion is axially rotated around the first axis in the concavity and the second portion is axially rotated around the second axis.

* * * * *